United States Patent [19]

Sugimoto

[11] 3,748,547

[45] July 24, 1973

[54] INSULATED-GATE FIELD EFFECT TRANSISTOR HAVING GATE PROTECTION DIODE

[75] Inventor: Eiji Sugimoto, Tokyo, Japan

[73] Assignee: Nippon Electric Company Limited, Tokyo, Japan

[22] Filed: June 21, 1971

[21] Appl. No.: 155,047

[30] Foreign Application Priority Data

June 24, 1970 Japan ............................... 45/55436

[52] U.S. Cl. ..... 317/235 R, 317/235 R, 317/235 D, 317/235 G, 307/304

[51] Int. Cl. ......................... H01l 11/00, H01l 15/00

[58] Field of Search ..................... 317/235 B, 235 D, 317/235 G; 307/202, 237, 304, 318

[56] References Cited

UNITED STATES PATENTS

| | | | |
|---|---|---|---|
| 3,590,340 | 6/1971 | Kubo | 317/235 |
| 3,673,427 | 6/1972 | McCoy | 317/235 |
| 3,403,270 | 9/1968 | Pace et al. | 317/235 |
| 3,469,155 | 9/1969 | Van Beek | 317/235 |
| 3,512,058 | 5/1970 | Khajezadeh et al. | 317/235 |
| 3,555,374 | 1/1971 | Usuda | 317/235 |
| 3,577,043 | 5/1971 | Cook | 317/235 |

FOREIGN PATENTS OR APPLICATIONS

| | | | |
|---|---|---|---|
| 1,170,705 | 11/1969 | Great Britain | 317/235 G |

*Primary Examiner*—John W. Huckert
*Assistant Examiner*—Andrew J. James
*Attorney*—Sandoe, Hopgood and Calimafde

[57] ABSTRACT

An insulated-gate field effect transistor is described which comprises a semiconductor substrate in which an insulated gate field effect transistor, and first and second regions having impurities at a high concentrations are formed. The first region is of the opposite conductivity type as that of the substrate, while the second region is of the same conductivity type as that of the substrate. The second region is in contact with one end of the first region, and the second region and/or the substrate is grounded. The end of the first region in contact with the second region is connected to the gate electrode of the insulated gate field effect transistor, and the other end of the first region is connected to the input electrode.

3 Claims, 7 Drawing Figures

INVENTOR
Eiji Sugimoto
by
Sandoe, Hopgood & Calimafde
ATTORNEYS

INVENTOR
Eiji Sugimoto by
Sandoe, Hopgood & Calimafde
ATTORNEYS

INSULATED-GATE FIELD EFFECT TRANSISTOR HAVING GATE PROTECTION DIODE

BACKGROUND OF THE INVENTION

1. Field of the Invention

This invention relates to an insulated-gate field effect transistor having a diode for protecting against insulator breakdown of the gate insulator film.

2. Description of the Prior Art

In a semiconductor integrated circuit, a high voltage resulting from static electricity, transient phenomenon, and the like may be unexpectedly applied to its electrodes. That high voltage tends to cause a breakdown of the semiconductor integrated circuit.

In an insulated gate field effect transistor, the insulator film beneath the gate electrode often suffers a breakdown as a result of such high voltage. To avoid this breakdown, various protecting means have been proposed. For example, it has been proposed that a diode be connected in parallel with the gate electrode of the insulated-gate field effect transistor whereby the gate insulator film is protected against insulator breakdown resulting from the high voltage exceeding a certain value. This protection diode is formed in a substrate that includes the insulated-gate field effect transistor. The impurity concentration of the substrate cannot, however, be made high enough to attain a favorable characteristic of the insulated gate field effect transistor. As a consequence, the breakdown voltage of the diode can not be made lower than about 100 V. This makes it difficult to realize a protection diode operable at a low breakdown voltage while still maintaining a sufficient protection effect for the field effect transistor. To reduce the diode breakdown voltage, one method has been proposed wherein an electrode is disposed on a comparatively thin insulation layer above the PN junction and is grounded, whereby the electric field on the surface of the PN junction is concentrated and thus the breakdown voltage at the PN junction is lowered (Field induced junction).

According to this method, however, a large resistance is unavoidable at the breakdown point of the PN junction and it is therefore difficult to obtain desirable protection for the insulated gate field effect transistor.

SUMMARY OF THE INVENTION

An object of this invention is to provide a semiconductor device which is protected against the breakdown of the gate insulator film resulting from a high voltage which may be applied to the gate electrode under an actual operating state.

The field effect transistor of the invention comprises a semiconductor substrate. An insulated gate field effect transistor having a source, drain, and gate electrodes is formed in that substrate, and a first high impurity concentration region is formed in a region of the substrate separate from the insulated gate field effect transistor and is of an opposite conductivity type than the substrate. A second high impurity concentration region forms a PN junction with the first region at one end of the first region, that one end of the first region is connected to the gate electrode of the insulated gate field effect transistor, and another end of the first region is coupled to an input signal source. The substrate and/or the second region are grounded.

In the field effect transistor of the invention, the breakdown voltage at the PN junction between the first and second regions can be set at a suitable value (80 – 20V) by establishing an impurity concentration in the first region at a suitable value such as $5 \times 10^{15}$ cm$^{-3}$ ~ $5 \times 10^{16}$ cm$^{-3}$. The series resistance at the breakdown point is remarkably smaller than that in the field induced junction.

Furthermore, in the field effect transistor of this invention, the voltage rise due to the series resistance produced in the event of a breakdown at said PN junction is limited by the resistance component between the one and the other ends of the first region, and thus the gate electrode of the insulated-gate field effect transistor connected to the one end of the first region is protected from a high voltage that may be unexpectedly applied to another end of the first region.

In summary, the field effect transistor of this invention has a protection diode connected in parallel with the gate electrode of the transistor. The diode is operable at a low breakdown voltage and at a low series resistance that appears in the event of breakdown. Therefore, even if a high voltage is applied to the signal input electrode, the voltage actually applied to the gate electrode of the field effect transistor can be limited to a sufficiently low value as compared to that in the prior art. Hence, the field effect transistor of the invention is particularly suited for applications of insulated-gate field effect transistors in which the gate insulator film must be protected.

The invention will be better understood from the following detailed description taken in conjunction with the accompanying drawings.

DESCRIPTION OF THE PREFERRED EMBODIMENTS

Figure 1:
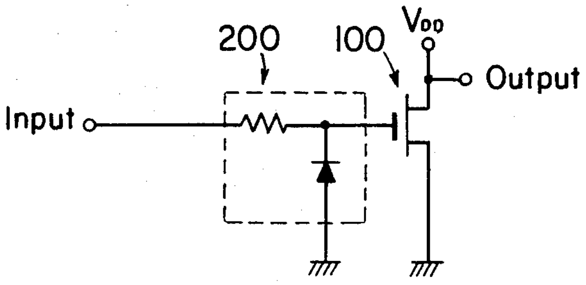
FIG. 1 is a circuit diagram showing a field effect transistor to which the protection means according to this invention is applicable.

Referring to FIG. 1, there is shown a circuit diagram using a gate protection device according to this invention, wherein a gate protection device 200 is disposed immediately before the gate of an insulated gate field effect transistor 100 for the purpose of preventing insulation breakdown which may be caused when an abnormal voltage is applied to the gate of the transistor.

Figure 2A:
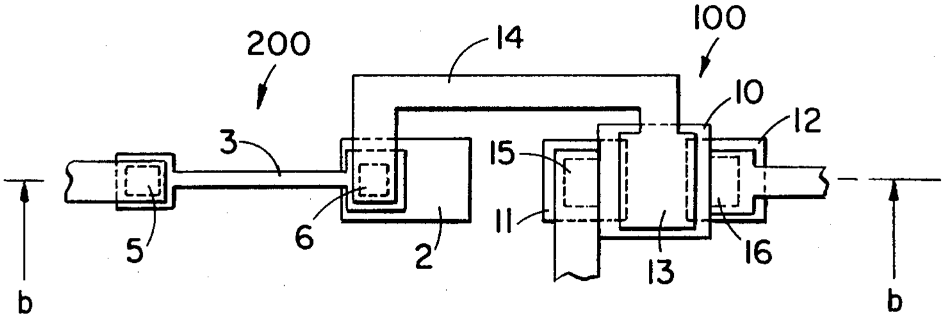
FIGS. 2(*a*) and (*b*) are a plan view and a cross sectional view of the field effect transistor of the invention, respectively.
Figure 2B:
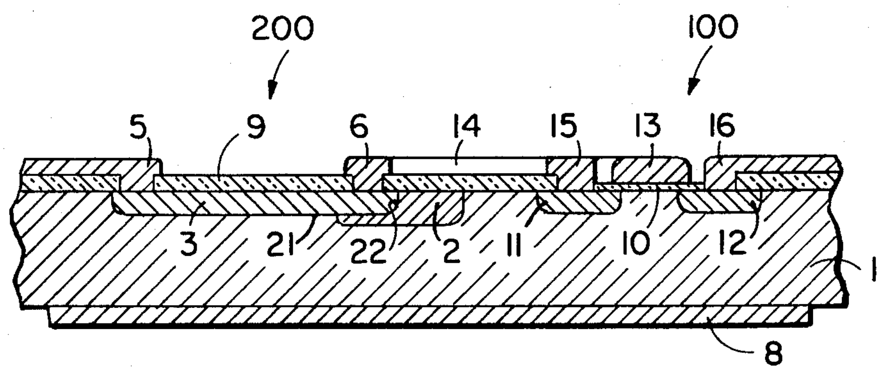

Referring to FIGS. 2(*a*) and (*b*) the semiconductor device comprises an N type silicon substrate 1 having an impurity concentration of about $10^{15}$ cm$^{-3}$. An insulated gate field effect transistor 100 formed on substrate 1 includes a source region 11, a drain region 12 and a gate electrode 13. A gate protection device 200 also formed on substrate 1 includes a $P^+$ type region 3, an $N^+$ type region 2; an input terminal 5, and an output terminal 6. A wiring layer 14 electrically connects the output terminal 6 of protection device 200 with the gate electrode 13 of transistor 100. The $N^+$ type region 2 is formed in the substrate 1 by a known selective diffusion technique, and then the region 3, source region 11 and drain region 12, which are of $P^+$ type, are formed by a diffusion technique in the same way. The impurity concentration of the $N^+$ type region 2 is about $10^{16}$ $cm^{-3}$, and that of the $P^+$ type regions 3, 11 and 12 is about $10^{19}$ $cm^{-3}$. Finally, aluminum is evaporated on both major surfaces of the substrate 1, and then the input terminal 5, output terminal 6, wiring layer 14, source electrode 15, drain electrode 16, gate electrode 13 and ground electrode 8 are formed by the ordinary photo-etching technique.

In the above described structure, the resistance component existing between terminals 5 and 6 is about 3 kΩ, and the terminal 6 is located adjacent to the PN junction 22 formed between $N^+$ type region 2 and $P^+$ type region 3.

The terminal 5 is used as an input terminal, the terminal 6 as an output terminal connected to the gate electrode of insulated gate field effect transistor 100, and the electrode 8 as an electrode connected to the ground circuit.

The foregoing structure can be easily formed by known semiconductor fabricating techniques and, hence, the forming process of the semiconductor device is not described in any detail in this specification.

In the above embodiment, the breakdown voltage at the PN junction 22 formed between $P^+$ type region 3 and $N^+$ type 2 is about 40 V, and that at the PN junction 21 formed between $P^+$ type region 3 and N type silicon substrate 1 is about 90 V.

Figure 3:
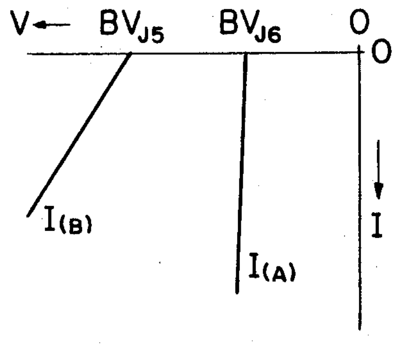
FIG. 3 diagrammatically shows the reverse voltage - current characteristics of the two PN junctions formed in the gate protection device of the transistor shown in FIG. 2.

The above semiconductor device is operated in the following manner. Referring to FIG. 3, which shows the reverse bias voltage vs current characteristics of the PN junctions 21 and 22, $I_{(A)}$ for that of the PN junction 22, and $I_{(B)}$ for that of the PN junction 21.

Figure 4:
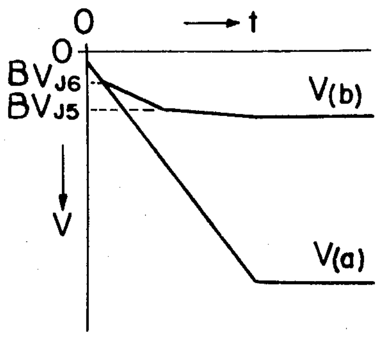
FIG. 4 is a diagram showing the relationship between input and output voltages of the transistor illustrated as in FIG. 2, and FIGS. 5(*a*) and (*b*) are a plan view and a cross-sectional view of a field effect transistor according to another embodiment of this invention, respectively.

FIG. 4 shows the relationship between the voltage applied to input terminal 5 and the voltage applied to output terminal 6 shown in FIG. 2(*a*). It is assumed that an input voltage $V(a)$ is applied to the input terminal 5. When the voltage $V(a)$ at the input terminal 5 is increased, the voltage $V(b)$ at the output terminal 6 is increased accordingly. When the voltage $V(b)$ at the output terminal 6 exceeds the breakdown voltage $BV_{J6}$ of the PN junction 22, a current corresponding to the characteristic shown in FIG. 3 flows and the voltage $V(b)$ at the output terminal 6 increases according to the following relationship.

$$V(b) = BV_{J6} + (r/R + r)\ (V(a) - BV_{J6})$$

where

R denotes the resistance value due to $P^+$ type layer 3 lying between input terminal 5 and output terminal 6, and

*r* denotes the resistance component in the reverse bias characteristic of the PN junction indicated by $I_{(A)}$ in FIG. 3.

In the above embodiment, R is set at 3 kΩ, *r* is set at 50 Ω, and $BV_{J6}$ is 40 V. Hence the voltage $V(b)$ at the output terminal 6 does not exceed $BV_{J6}$. For example, when voltage $V(a)$ is 1,000 V, voltage $V(b)$ is limited to 56 V.

When the voltage $V(a)$ at the input terminal 5 exceeds the breakdown voltage $BV_{J5}$ of the PN junction 21, a current corresponding to the characteristic $I_{(B)}$ shown in FIG. 3 flows therein. The quantity of this current is not appreciably large because the resistance component is large enough as shown by the in FIG. 3 by characteristic $I_{(B)}$.

Therefore, compared with the conventional devices, the semiconductor device of this invention has the following technical advantages: the breakdown voltage of the protection diode is low; the resistance component produced at the breakdown point is small; and there is no possibility of producing an abnormally high voltage even in the event of a breakdown. In to the prior art dated gate field-effect transistor, it has not been possible to lower the breakdown voltage; in contrast, in the field field-effect-transistor of this invention, a sufficiently low breakdown voltage can be obtained by controlling the impurity concentration of the $N^+$ type region 2 of the gate protection device. Thus, the design concepts of the invention can be effectively applied to an insulated gate field effect transistor in which the gate insulator film is thin.

In the prior art field-effect transistor, the breakdown voltage can be reduced considerably by the use of a field induced junction diode. The resistance component produced at the breakdown point of this transistor is, however, large, and a high voltage is produced at the output terminal in the event of a breakdown. The the prior art is not sufficiently effective for the purpose of circuit protection. In contrast, the transistor according to this invention, the resistance component produced at the breakdown point is small, and there is no possibility of producing a high voltage at the output terminal by virtue of the resistance component of the $P^+$ type region 3 of the gate protection device even in the event of a breakdown.

Figure 5A:
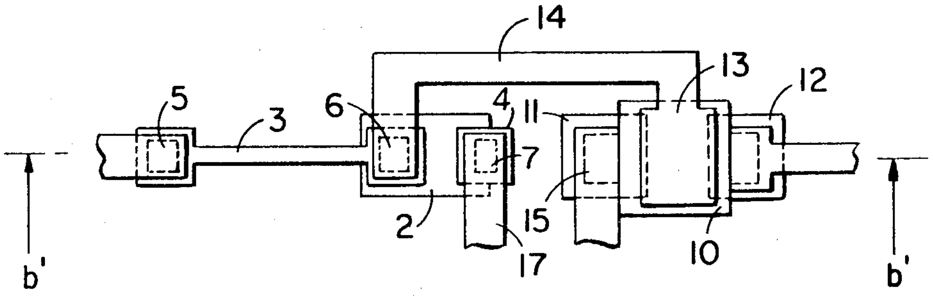
Figure 5B:
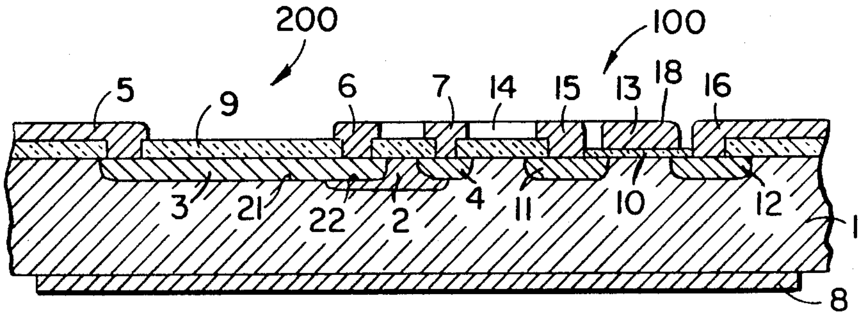

FIGS. 5(*a*) and (*b*), in which elements corresponding to those of the embodiment of the invention shown in FIGS. 2(*a*) and 2(*b*) are represented by corresponding reference numerals show a transistor according to another embodiment of the invention, a $P^+$ type region 4 having an impurity concentration of about $10^{19}$ $cm^{-3}$ is formed in the $N^+$ type region 2 and substrate 1 near the $P^+$ type region 3 shown in FIG. 1. This $P^+$ type 4 is used for drawing out a grounding electrode 7. It is desirable that the distance between the $P^+$ type regions 3 and 4 is determined so as not to cause a punch-through phenomenon; practically, this distance is about $10\mu$.

In the above arrangement, the circuit can be grounded with very low resistance via a metal lead 17 having a high conductivity connected to grounding electrode 7. Therefore, the resistance component observed at the breakdown point can be even more markedly reduced. In the embodiment shown in FIG. 1, the breakdown current at a high voltage flows to ground through the substrate whose impurity concentration is comparatively low. In contrast, in the second embodiment of FIG. 5, the breakdown current is grounded through a metal lead whereby it is possible to reduce the resistance component produced at the breakdown point.

In the embodiment shown, $P^+$ type region 4 is in ohmic contact with the electrode 7. Alternatively, the conductivity type of region 4 may be $N^+$ type with a high impurity concentration, and the electrode 7 may be directly brought into ohmic contact with $N^+$ type region 2 in the event the impurity concentration is high enough.

In the above described embodiments, the $N^+$ type region 2 is located adjacent to terminal 6 of $P^+$ type region 3. Terminal 6 is used for connecting of the gate electrode of an insulated-gate field effect transistor. Instead, the $N^+$ type region 2 may be formed all over surface of the substrate 1 except for the gate region of the insulated-gate field effect transistor 100 and the necessary parts and adjacent parts of the P type regions other than $P^+$ type region 3. In this embodiment, the edge effect and the parasitic MOS effect observed due to the channels formed in the part other than the gate region 18 (in FIG. 5(*b*)) of the insulated-gate field effect transistor 100 can be prevented. This is because the part between the P type regions except the gate region 18 (in FIG. 5(*b*)) of the field effect transistor 100, formed of a high concentration region and the voltage necessary to invert the conductivity type between these regions is high. As is apparent from the foregoing the present invention finds application mainly to MOS integrated circuit devices.

While a few specific embodiments of the invention have been described in detail, it is clearly understood that the scope of the invention is not limited thereto or thereby.

What is claimed is:

1. An insulated gate field effect transistor with means for protecting against excessive gate voltage comprising a semiconductor substrate having a first conductivity type; an insulated gate field effect transistor formed in said substrate having source and drain regions of a second conductivity type opposite to said first conductivity type, source and drain electrodes respectively connected to said source and drain regions, and a gate electrode formed on an insulator film lying on said substrate in the region between said source and drain electrodes; a generally elongated first resistance region formed on said substrate separately from said transistor, having a high impurity concentration of said second conductivity type, an input terminal connected to one end of said resistance region, and an output terminal connected to the other end of said resistance region, a first P-N junction being formed at said one end between said resistance region and said substrate; a second region formed on said substrate in contact with said other end of said first region, a second P-N junction being formed between said second region and said resistance region at said other end, said second region having a relatively high impurity concentration of said first conductivity type as compared to said substrate, means for connecting said output terminal to said gate electrode, the breakdown voltage of said second P-N junction being lower than that of said first P-N junction, whereby the application of an excessive voltage to said input terminal causes a breakdown of said second P-N junction, such that a voltage reduced by the amount of the voltage drop across said first resistance region is developed at said output terminal, a third region of one of said first and second conductivity types formed in said substrate and having a high impurity concentration disposed adjacent to said other end of said first region, and a wiring layer formed on said substrate for grounding said third region.

2. The semiconductor device as claimed in claim 1, wherein said third region is of said second conductivity type and is formed in said second region.

3. The semiconductor device as claimed in claim 1, wherein said third region is of said first conductivity type.

* * * * *